(12) United States Patent
Al-Qaq et al.

(10) Patent No.: US 9,362,868 B2
(45) Date of Patent: Jun. 7, 2016

(54) REDUCED POWER AMPLIFIER LOAD IMPACT FOR OPEN LOOP ENVELOPE TRACKING

(71) Applicant: Futurewei Technologies, Inc., Plano, TX (US)

(72) Inventors: Wael Al-Qaq, Oak Ridge, NC (US); Hong Jiang, Kernersville, NC (US); Zhihang Zhang, Cary, NC (US)

(73) Assignee: Futurewei Technologies, Inc., Plano, TX (US)

( * ) Notice: Subject to any disclaimer, the term of this patent is extended or adjusted under 35 U.S.C. 154(b) by 94 days.

(21) Appl. No.: 14/094,395

(22) Filed: Dec. 2, 2013

(65) Prior Publication Data

US 2015/0155835 A1    Jun. 4, 2015

(51) Int. Cl.
| H03G 3/20 | (2006.01) |
| H03F 1/32 | (2006.01) |
| H04B 1/62 | (2006.01) |
| H03F 1/02 | (2006.01) |
| H03F 3/195 | (2006.01) |
| H03F 3/24 | (2006.01) |

(52) U.S. Cl.
CPC ............ *H03F 1/3241* (2013.01); *H03F 1/0222* (2013.01); *H03F 3/195* (2013.01); *H03F 3/24* (2013.01); *H04B 1/62* (2013.01); *H03F 2200/102* (2013.01); *H03F 2200/336* (2013.01); *H03F 2200/555* (2013.01)

(58) Field of Classification Search
CPC . H03F 3/24; H03F 1/3247; H03F 2201/3227; H03F 3/191; H03F 2200/465; H03F 1/02; H04B 1/0475; H04B 1/04; H04B 1/1607; H04B 1/10; H03G 1/0005
See application file for complete search history.

(56) References Cited

U.S. PATENT DOCUMENTS

| 6,735,419 | B2 * | 5/2004 | Mitzlaff ..................... 455/127.1 |
| 8,909,180 | B1 * | 12/2014 | Murji ......................... 455/127.1 |
| 2006/0209984 | A1 | 9/2006 | Kenington et al. |
| 2011/0058601 | A1 * | 3/2011 | Kim et al. ..................... 375/238 |
| 2011/0201287 | A1 * | 8/2011 | Pratt et al. ..................... 455/126 |
| 2012/0200354 | A1 * | 8/2012 | Ripley et al. .................. 330/131 |
| 2012/0200435 | A1 * | 8/2012 | Ngo et al. ........................ 341/61 |
| 2012/0306572 | A1 * | 12/2012 | Hietala et al. ................. 330/131 |
| 2012/0309333 | A1 * | 12/2012 | Nambu et al. .............. 455/127.1 |
| 2013/0072139 | A1 | 3/2013 | Kang et al. |

(Continued)

OTHER PUBLICATIONS

Foreign Communication From a Counterpart Application, PCT Application No. PCT/CN2014/092484, International Search Report dated Mar. 4, 2015, 7 pages.

(Continued)

*Primary Examiner* — Kenneth Lam
(74) *Attorney, Agent, or Firm* — Conley Rose, P.C.; Grant Rodolph; William H. Dietrich

(57) ABSTRACT

A method for implementing envelope tracking (ET), the method comprising switching from a receiver (Rx) radio frequency (RF) path to a supply sensing path during factory calibration, sensing the power amplifier (PA)'s supply voltage via the supply sensing path, comparing the PA's supply voltage to a corresponding reference supply voltage, determining the difference between the PA's supply voltage and the corresponding reference supply voltage, and updating one or more parameters used to perform a PA load pre-distortion during factory calibration, wherein the PA load pre-distortion is used to match the PA's supply voltage to the corresponding reference supply voltage.

20 Claims, 10 Drawing Sheets

(56) References Cited

U.S. PATENT DOCUMENTS

2013/0094533 A1* 4/2013 Weichmann et al. ............ 372/98
2014/0167843 A1* 6/2014 Asensio et al. ............... 330/127
2014/0187182 A1* 7/2014 Yan et al. ................... 455/115.1
2014/0194080 A1* 7/2014 Li et al. ...................... 455/226.1
2014/0312974 A1* 10/2014 Khesbak et al. .............. 330/279

OTHER PUBLICATIONS

Foreign Communication From a Counterpart Application, PCT Application No. PCT/CN2014/092484, Written Opinion dated Mar. 4, 2015, 4 pages.

* cited by examiner

REDUCED POWER AMPLIFIER LOAD IMPACT FOR OPEN LOOP ENVELOPE TRACKING

STATEMENT REGARDING FEDERALLY SPONSORED RESEARCH OR DEVELOPMENT

Not applicable.

CROSS-REFERENCE TO RELATED APPLICATION

Not applicable.

REFERENCE TO A MICROFICHE APPENDIX

Not applicable.

BACKGROUND

A transmitter's overall efficiency within a wireless terminal, such as a cellular phone, is a key metric in determining the operating time or talk time for the wireless terminal. The wireless terminal comprises a power amplifier (PA) that consumes a sizeable amount of current when transmitting signals at relatively high output power levels. One method to reduce the PA current consumption and/or improve PA efficiency is to modulate the supply voltage for the PA. For instance, the supply voltage can be modulated using an envelope tracking (ET) system that dynamically adjusts the supply voltage for the PA based on the PA's input signal level. Rather than applying the wireless terminal's battery voltage directly to the PA's supply voltage, the wireless terminal's battery is typically connected to an ET modulator, and the output of the ET modulator is connected to the PA supply voltage pin. The ET modulator can reduce the PA's supply voltage when the PA input signal level is relatively low and increase the PA's supply voltage when the PA input signal level is relatively high. Thus, the ET modulator improves the efficiency in providing the PA's supply voltage by reducing unnecessary headroom.

One of the challenges for implementing an ET system within a wireless terminal is managing the PA load variations seen by the ET modulator. Typically, the ET modulator can experience PA loads that substantially fluctuate depending on the PA's power. For example, when the PA outputs relatively low power, the PA consumes relatively low current causing the impedance on the PA's supply voltage line to be relatively high. Conversely, when the PA outputs relatively high power, the PA consumes relatively high current causing the impedance on the PA's supply voltage line to be relatively low. To accurately track the varying PA loads, a closed loop ET modulator may implement a feedback loop that tracks the PA load and adjusts the PA's supply voltage accordingly. Unfortunately, the feedback loop utilized by the closed loop ET modulator can often cause stability issues that affect the overall performance of the ET system.

As an alternative, an ET system may utilize an open loop ET modulator to mitigate the stability issues that arise from the feedback loop within a closed loop ET modulator. In contrast to a closed loop ET modulator, the open loop ET modulator may not implement a feedback path to detect the varying PA loads. Unfortunately, without a feedback path, the PA load variations may cause the open loop ET modulator to yield varying voltage reference inputs that produce an overall system degradation of the wireless terminal. To alleviate this problem, the open loop ET modulator may need to be configured to digitally pre-distort the PA load variation. However, for the pre-distortion to be effective, the open loop ET modulator may need to obtain accurate information about the imperfections between the open loop ET modulator and the PA's supply. For instance, the open loop ET modulator may need to obtain information about the PA load variations under dynamic signal excitation (e.g. Long Term Evolution (LTE)), as well as the inductor-capacitor (LC) filter response information.

SUMMARY

In one embodiment, the disclosure includes an apparatus for providing ET, comprising: a memory, a processor coupled to the memory, wherein the memory includes instructions that when executed by the processor cause the apparatus to perform the following: switch to a supply sensing path during factory calibration, determine a PA supply voltage from the supply sensing path, compare the PA supply voltage with a corresponding reference supply voltage during factory calibration, and generate an error signal based on the difference between the PA supply voltage during factory calibration, wherein the error signal is used to update one or more parameters that generate a PA load pre-distortion signal, and wherein the PA load pre-distortion signal is used to generate the PA supply voltage.

In another embodiment, the disclosure includes an apparatus for providing ET, comprising a PA supply sensing system and a PA load variation pre-distortion operatively coupled to the PA supply sensing system, wherein the PA supply sensing system is configured to: switch to an on state during factory calibration, switch to an off state during transmission of radio frequency (RF) signals, compare a reference supply voltage signal to a PA supply voltage signal during the on state, and generate an error signal used to update one or more parameters within the PA load variation pre-distortion, wherein the PA load variation pre-distortion is configured to generate a pre-distortion compensation signal using the updated parameters.

In yet another embodiment, the disclosure includes a method for implementing ET, the method comprising switching from a receiver (Rx) RF path to a supply sensing path during factory calibration, sensing a PA's supply voltage via the supply sensing path, comparing the PA's supply voltage to a corresponding reference supply voltage, determining the difference between the PA's supply voltage and the corresponding reference supply voltage, and updating one or more parameters used to perform a PA load pre-distortion during factory calibration, wherein the PA load pre-distortion is used to match the PA's supply voltage to the corresponding reference supply voltage.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems, apparatuses, and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents. While certain aspects of conventional technologies have been discussed to facilitate the present disclosure, applicants in no way disclaim these technical aspects, and it is contemplated that the present disclosure may encompass one or more of the conventional technical aspects discussed herein.

Figure 1:
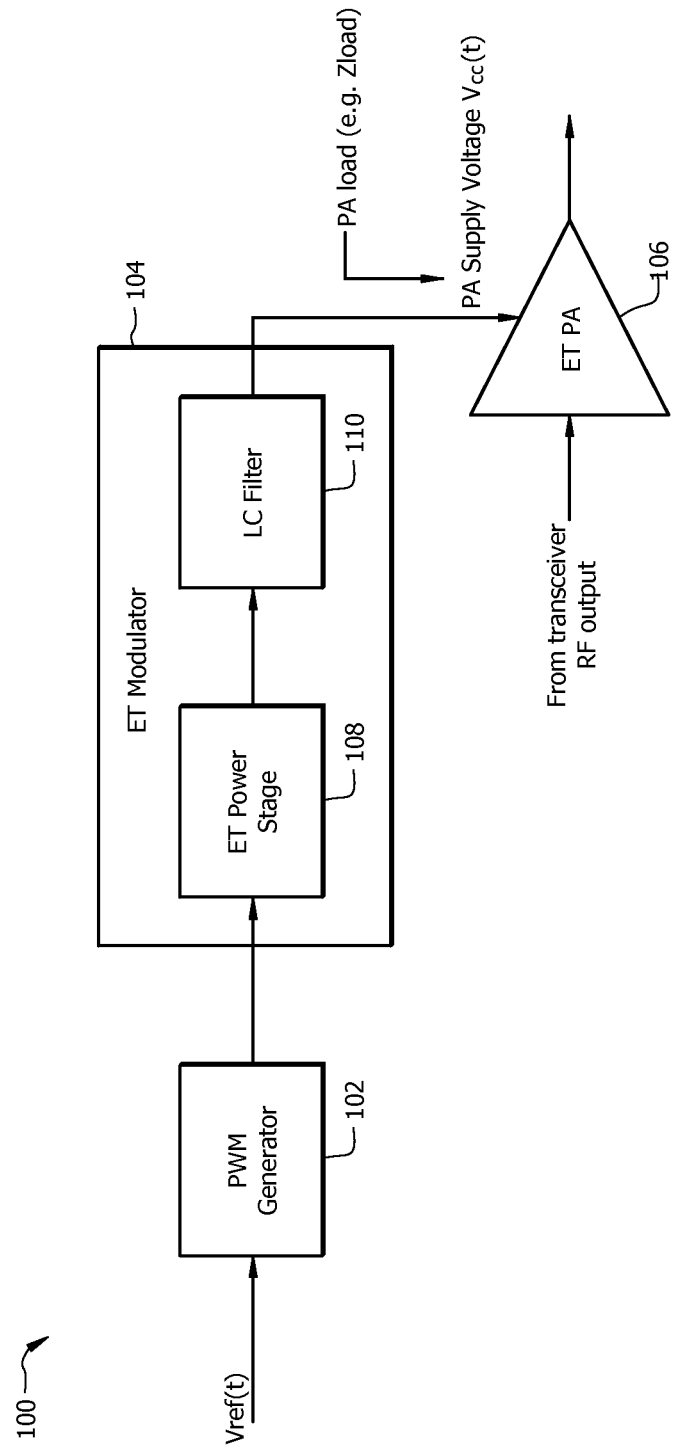
FIG. 1 is a schematic diagram of an embodiment of an open loop ET modulator system.

FIG. 1 is a schematic diagram of an embodiment of an open loop ET modulator system 100. The open loop ET modulator system 100 may comprise a PWM generator 102, an open loop ET modulator 104, and an ET PA 106. The PWM generator 102 may receive an input reference supply voltage signal Vref(t) and perform pulse-width-modulation on the reference supply voltage signal Vref(t) to generate digital pulses that represent the desired reference supply voltage signal Vref(t). The reference supply voltage signal Vref(t) may be in-phase/quadrature (IQ) data that has undergone envelope processing. The PWM generator 102 outputs and feeds the digital pulses into the open loop ET modulator 104. Within the open loop ET modulator 104, the ET switching power stage 108 initially receives the digital pulses and may modify the switching frequency to generate a required current. The ET switching power stage 108 may also be configured to reduce switching losses. The LC filter 110 may receive the modified digital pulses from the ET switching power stage 108 and filter the modified digital pulses to remove clock spurs and other high frequency impairments before outputting the modified digital pulses as the PA supply voltage.

The open loop ET modulator 104 is configured to replicate the reference supply voltage signal Vref(t) as the PA supply voltage (e.g. integrated circuit (IC) power supply voltage (t) (Vcc(t))). When the RF input of the PA is relatively low, the PA draws a relatively small amount of current, which typically means the PA load looking in from the PA supply voltage is relatively large. Conversely, when the RF input of the PA is relatively high, the PA draws a relatively large amount of current, which typically means the load looking in from the PA supply voltage is relatively small. Thus, variations in the PA supply load may impact the frequency response of the LC filter 110 and the accuracy of matching the PA supply voltage Vcc(t) with the reference supply voltage signal Vref(t).

Figure 2:
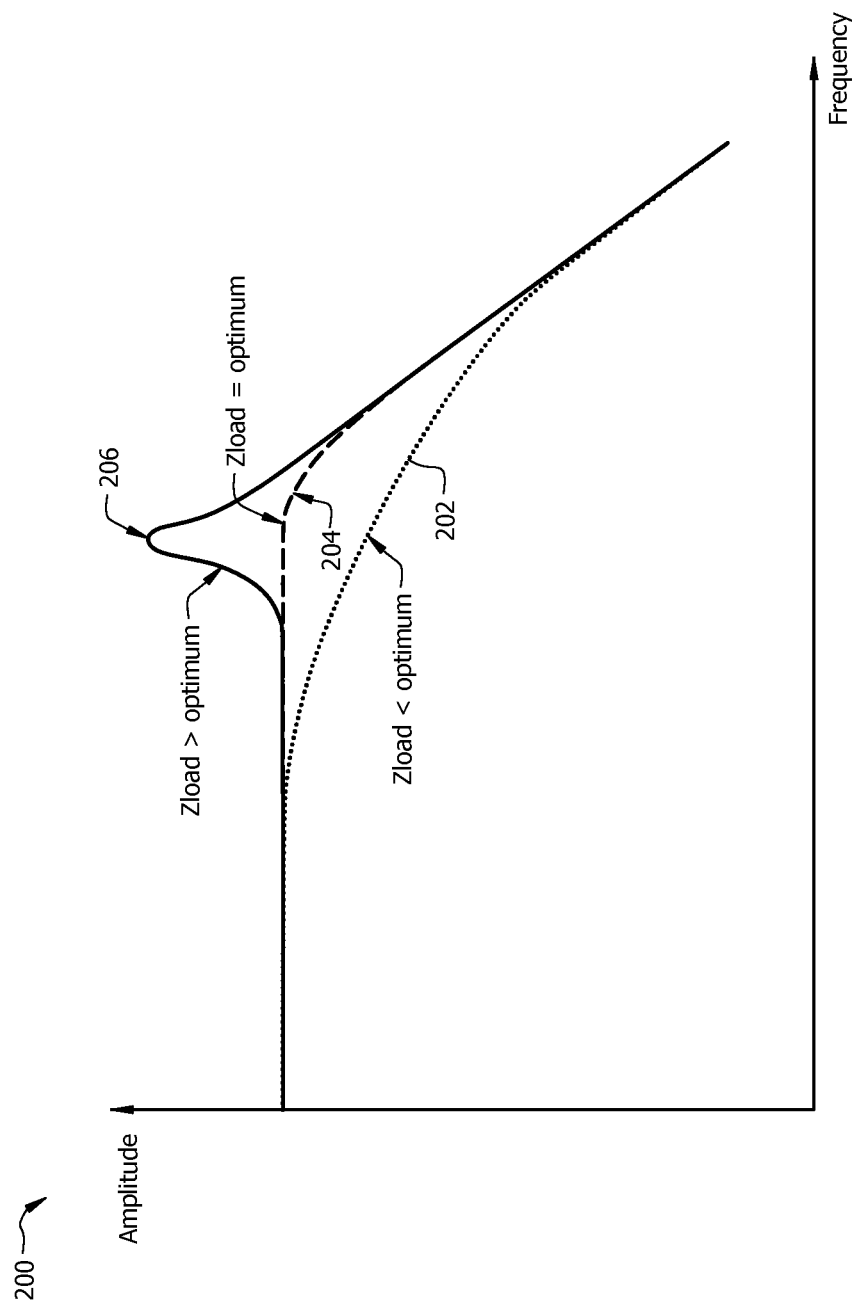
FIG. 2 illustrates a plot for the impact of PA load variation on the ET modulator's frequency response.

FIG. 2 illustrates a plot 200 for the impact of PA load variation on the ET modulator's frequency response. The impedance load (Zload) from the PA and experienced by the open loop ET modulator may be a function of the RF envelope signal and the PA supply voltage Vcc(t). The PA load variation may cause nonlinearity and/or peaking or drooping in the LC filter frequency response. In plot 200, the Amplitude axis (e.g. y-axis) represents the LC filter frequency response while the x-axis represents frequency. Plot 200 further depicts three different Zload curves 202, 204, and 206 that demonstrate how the LC filter frequency response changes when the Zload changes. Specifically, Zload curve 202 represents when the actual PA load experienced by the ET modulator is relatively smaller than an optimal PA load configured for the open loop ET modulator; Zload curve 204 represents when the actual PA load experienced by the open loop ET modulator is about equal to the optimal PA load configured for the open loop ET modulator; and Zload curve 206 represents when the actual PA load experienced by the open loop ET modulator is relatively greater than the optimal PA load configured for the open loop ET modulator.

In FIG. 2, the Zload curve 202 illustrates that the LC filter's frequency response is over damped, which means that the open loop ET modulator outputs only the lower frequency portion of the envelope signal. In contrast, Zload curve 206 depicts that the LC filter's frequency response is under damped, which means the higher frequency content of the envelope signal is amplified excessively by the open loop ET modulator. Thus, both the under damped and over damped scenarios may cause an overall performance degradation because of the inaccurate tracking of the PA load. Typically, to minimize performance degradation, open loop ET modulators may be designed with low pass and LC filter parameters that produce over damping and under damping at relatively moderate levels. In other words, without a method to accurately track PA load variations, a design tradeoff may be employed for the open loop ET modulators in order to balance the stability of the system (e.g. under damped case) and the performance of the system (e.g. over damped case).

Disclosed herein are at least one method, apparatus, and system that implements a PA load variation pre-distortion to manage varying PA loads for an open loop ET modulator system. In one embodiment, the PA load variation pre-distortion may dynamically sense the PA supply voltage Vcc(t) via a PA supply sensing system during factory calibration. The sensed PA supply voltage Vcc(t) may be compared to the reference supply voltage Vref(t) in order to update and/or determine a PA load variation pre-distortion using a factory calibration adaptation algorithm. To prevent stability issues, the PA supply sensing system may operate during factory calibration and may not be operational during the open loop ET modulator system's normal mode of operation. During the normal mode of operation (e.g. transmission of RF signals via the wireless transmitter) and/or non-factory calibration use, the open loop ET modulator may use the PA load variation pre-distortion obtained during factory calibration to output the desired PA supply voltage Vcc(t) under nominal conditions and varying processes. Specifically, the PA load variation pre-distortion may be configured to produce a pre-distortion compensation signal that attempts to match the reference supply voltages Vref(t) to the PA supply voltages Vcc(t).

Figure 3:
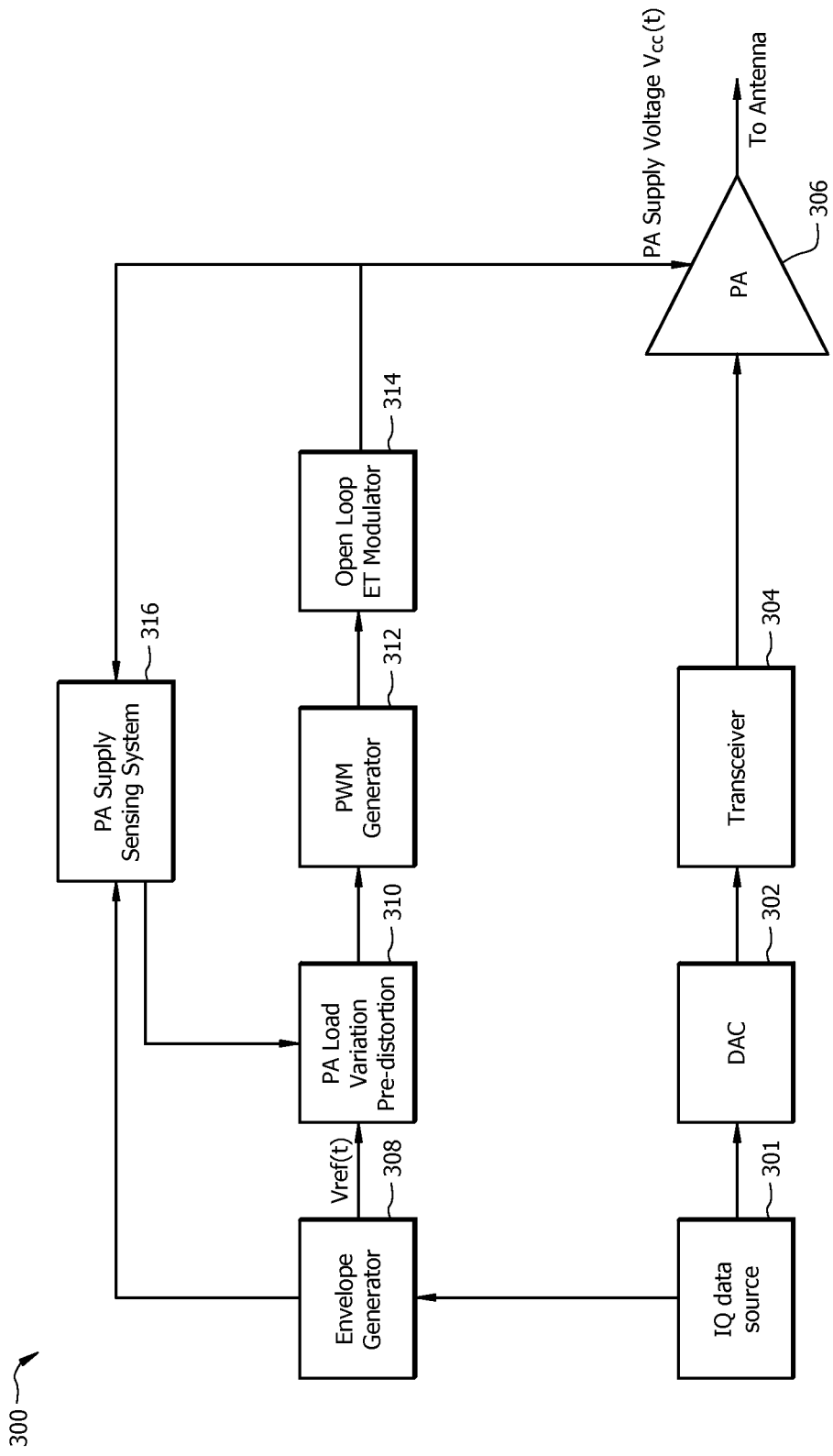
FIG. 3 is a schematic diagram of an embodiment of an open loop ET modulator system where embodiments of the present disclosure may operate.

FIG. 3 is a schematic diagram of an embodiment of an open loop ET modulator system 300 where embodiments of the present disclosure may operate. In one embodiment, the open loop ET modulator system 300 may be found within any wireless terminal configured to transmit RF signals. The open loop ET modulator system 300 may comprise an IQ data source 301, a digital-to-analog converter (DAC) 302, a transceiver 304, a PA 306, an envelope generator 308, a PA load variation pre-distortion 310, a PWM generator 312, an open loop ET modulator 314, and a PA supply sensing system 316. The open loop ET modulator system 300 may be sub-divided into a signal path and envelope path during the normal mode of operation. The DAC 302, transceiver 304, and PA 306 may be part of the signal path, and the envelope path may comprise the envelope generator 308, PA load variation pre-distortion 310, PWM generator 312, and open loop ET modulator 314. The signal path may generate the RF signal used for transmission via a wireless terminal's transmitter (e.g. RF signal outputted via an antenna), and the envelope path may provide ET functionality to generate a PA supply voltage Vcc(t) that substantially matches the reference supply voltage Vref(t). As shown in FIG. 3, the signal path and envelope path may merge at the PA 306, which may be any amplifying device that generates the amplified RF signal.

FIG. 3 illustrates that the signal path may obtain the modulated IQ data from an IQ data source 301. The IQ data source 301 may be any device configured to convert digital data outputted from the baseband to I and Q components. Components I and Q data may be eventually converted separately by local oscillators to the desired RF carrier frequency within the signal path. In the signal path shown in FIG. 3, the IQ data source 301 may forward the IQ data to DAC 302 to convert the IQ data (e.g. a digital signal) to a baseband analog signal. The DAC 302 may be any device used to convert digital signals into analog signals. Afterwards, the DAC 302 may output the baseband analog signal to the transceiver 304, which may be any device used to convert the baseband analog signal to an RF signal. For example, the transceiver 304 may comprise a transmitter, a receiver, a low pass filter, and an RF variable gain amplifier (VGA). The transceiver 304 may output the RF signal and send (e.g. transmit) the RF signal to the PA 306 in order to amplify the RF signal to an appropriate level. The PA 306 outputs the amplified RF signal that is eventually transmitted via the antenna of the wireless terminal. Persons of ordinary skill in the art are aware that signal path may include additional components (e.g. filter, delay components, amplifiers, etc.) used to convert and process digital data into an amplified RF signal for wireless transmission. The use and discussion of the signal path in FIG. 3 is only an example to facilitate ease of description and explanation.

The envelope path may comprise an open loop ET modulator 314. In contrast to a closed loop ET modulator, the open loop ET modulator 314 may not comprise an analog feedback path to track varying PA loads. Typically, the analog feedback path returns the PA supply voltage Vcc(t) as an input to the closed loop ET modulator in order to match the reference supply voltage Vref(t) and PA supply voltage Vcc(t). Thus, the analog feedback path for a closed loop ET modulator may provide current sensing. Without an analog feedback path, the open loop ET modulator 314 and open loop ET modulator system 300 may not suffer from stability issues caused by the analog feedback path. Moreover, an error amplifier (e.g. class "AB" error amplifier) that suppresses residual impairments (e.g. stability issues) caused by the feedback path may not be used within the open loop ET modulator 314. As such, the open loop ET modulator 314 may provide current savings when compared to a closed loop ET modulator. FIG. 3 also illustrates that the envelope path may be implemented in the digital domain, and thus does not include a DAC and/or a reconstruction filter (RCF) generally found within an envelope path that comprises an analog closed loop ET modulator.

The envelope path may generate a dynamic PA supply voltage Vcc(t) that corresponds to the amplitude or "envelope" of the RF signal generated in the signal path. The envelope generator 308 may receive the IQ data and generate an envelope signal in response to the IQ data. In other words, the voltage levels (e.g. about zero volts (V)) for the envelope signal may be determined from the voltage range (e.g. about one to two V) of the IQ data. Persons of ordinary skill in the art are aware that a variety of methods may be used to implement an envelope generator 308 that processes IQ data. Afterwards, the envelop generator 308 may forward the envelope signal to a PA load variation pre-distortion 310.

The PA load variation pre-distortion 310 may be configured to correct the envelope signal such that PA supply voltage Vcc(t) outputted by the open loop ET modulator 314 substantially matches the reference supply voltage Vref(t) received from the envelope generator 308. The PA load variation pre-distortion 310 may model the nonlinear load current of PA 306 in the digital domain to prevent distortion of the PA supply voltage Vcc(t) caused by the PA's 306 nonlinear load impedance. To correct the envelope signal, the PA load variation pre-distortion 310 may add an error correction signal to the envelope signal prior to PWM conversion to form a pre-distortion compensation signal. In one embodiment, to produce the error correction signal, the PA load variation pre-distortion 310 may obtain the PA nonlinear load characterization during factory calibration via the PA supply sensing system 316. The PA load variation pre-distortion 310 may also be configured to implement up sampling and/or down sampling to improve the accuracy of the load pre-distortion filters within the PA load variation pre-distortion 310. By determining the error correction signal and applying it to the envelope signal, the PA load variation pre-distortion 310 may minimize the nonlinear load impact on the LC filter within the open loop ET modulator 314. As such, the PA load variation pre-distortion 310 may compensate for impairments due to nonlinear, time-varying load impedance for the open loop ET modulator system 300.

The PA load variation pre-distortion 310 may subsequently output the pre-distortion compensation signal to the PWM generator 312. The PWM generator 312 may be configured to perform a PWM on the compensated envelope signal to create a pulse wave that conforms to the compensated envelope signal. In other words, the PWM generator 312 may improve signal linearity by performing signal modulation in the digital domain where the widths of the pulses correspond to specific data values of the compensated envelope signal. The PWM generator 312 may then forward the outputted digital PWM signal to the open loop ET modulator 314. The open loop ET modular 314 may use the digital PWM signal and battery voltage to generate the PA supply voltage Vcc(t). The PA supply voltage signal Vcc(t) is then fed into PA 306 to provide the supply voltage for PA 306 that corresponds to the RF signal from the signal path. The open loop ET modulator 314 and PA load variation pre-distortion 310 will be discussed in more detail in FIGS. 4 and 5.

FIG. 3 also illustrates that the open loop ET modulator system 300 may comprise a PA supply sensing system 316. The PA supply sensing system 316 may be operational during factory calibration, but not during the normal mode of operation of the ET modulator system 300. The PA supply sensing system 316 may be part of the sensing path that compares reference supply voltage Vref(t) to the PA supply voltage Vcc(t) (e.g. using signal to noise ratio (SNR)) and updates parameters (e.g. filter parameters) within the PA load variation pre-distortion 310 during factory calibration. The open loop ET modulator system 300 may not implement the PA supply sensing system 316 during normal mode of operations and/or non-factory calibration operations. During factory calibration, the reference supply voltage Vref(t) may be set or generated using LTE (e.g. LTE-band 20), Wideband Code Division Multiple Access (WCDMA), and/or other types of stimulus signals (e.g. sinusoidal-based wave) generated on-chip. The PA supply sensing system 316 may sense the PA supply voltage Vcc(t) and determine the difference between the reference supply voltage Vref(t) and the PA supply voltage Vcc(t). After the comparison, the PA supply sensing system 316 may update parameters within the PA load variation pre-distribution 310 to improve the SNR and/or other equivalent metrics between the reference supply voltage Vref(t) and the PA supply voltage Vcc(t), in order to match the voltage levels for the reference supply voltage Vref(t) and the PA supply voltage Vcc(t). The PA supply sensing system 316 will be discussed in more detail below.

Figure 4:
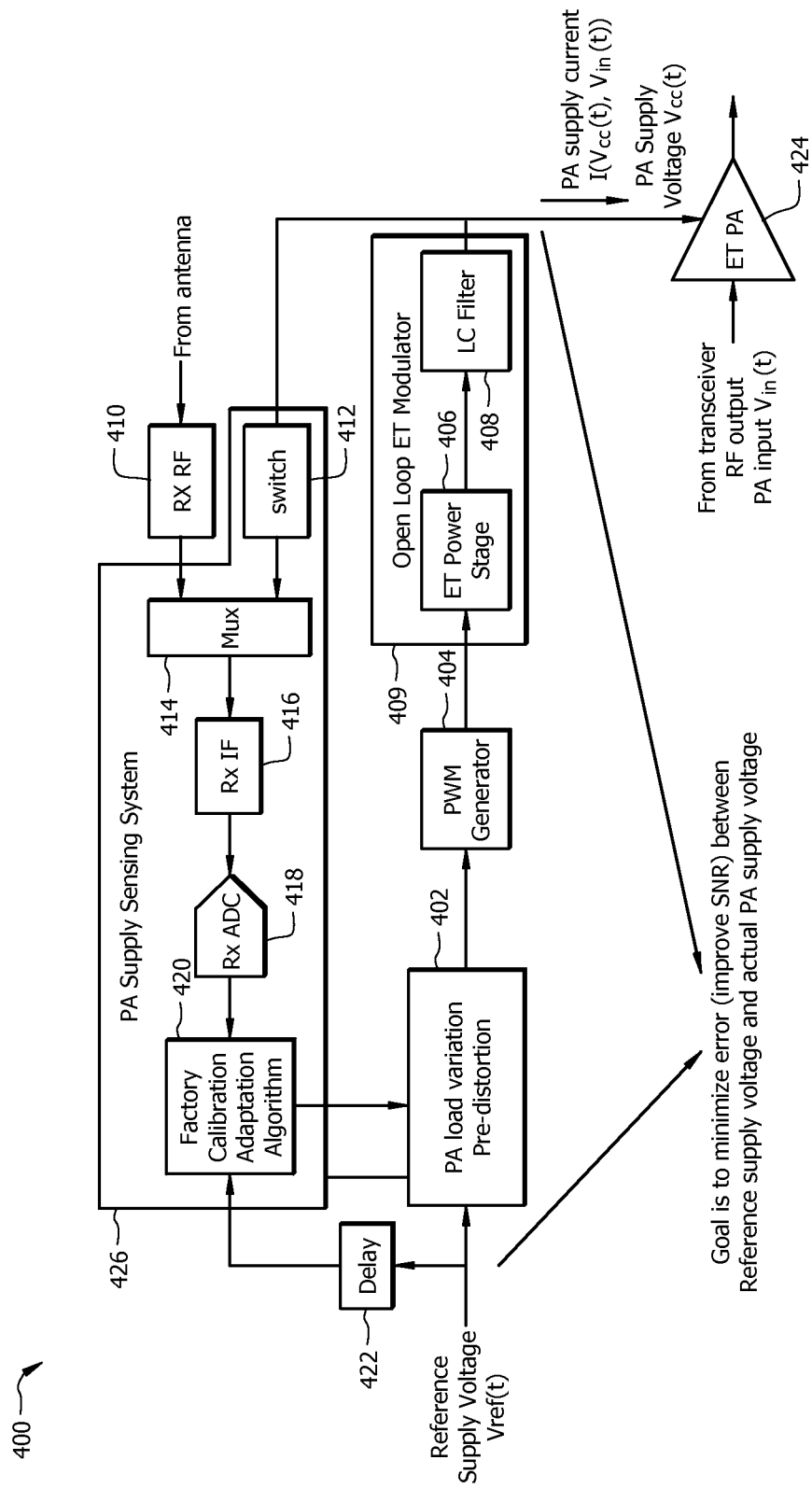
FIG. 4 is a schematic diagram of an embodiment of an open loop ET modulator system configured with dynamic sensing during factory calibration.

FIG. 4 is a schematic diagram of an embodiment of an open loop ET modulator system 400 configured with dynamic sensing during factory calibration. The open loop ET modulator system 400 comprises a PA load variation pre-distortion 402, a PWM generator 404, an open loop ET modulator 409, an Rx RF path component 410, a delay component 422, an ET PA 424, and a PA supply sensing system 426. The open loop ET modulator 409 may comprise an ET power stage 406 and an LC filter 408, and the PA supply sensing system 426 may comprise a switch 412, a multiplexer 414, an Rx intermediate frequency (IF) path component 416, an Rx analog-to-digital converter (ADC) 418, and a factory calibration adaptation algorithm module 420. Under the normal mode of operation (e.g. transmission of RF signals via the wireless transmitter) and/or non-factory calibration use, the PWM generator 404 may receive the IQ data and function substantially similar to the PWM generator 312 discussed in FIG. 3. Afterwards, the ET power stage 406 may receive the envelope signal from the PWM generator 404. The ET power stage 406 may comprise one or more power stages that modify the switching frequency of the PWM signal and generate the required current. The ET power stage 406 may then forward the PWM signal to the LC filter 408. The LC filter 408 may comprise one or more lower order and/or higher order filters (e.g. two poles and/or six poles) that modify the PWM signal by removing clock spurs and other high frequency impairments before feeding the signal as the actual PA supply voltage Vcc(t). The LC filter 408 may comprise one or more low pass filters that drive the PA supply voltage Vcc(t).

The sensing path may comprise the PA supply sensing system 426, which is substantially similar to the PA supply sensing system 316 discussed in FIG. 3. As shown in FIG. 4, the PA supply current I(Vcc(t), Vin(t)) is a function of the PA supply voltage Vcc(t) and the PA input Vin(t). In one embodiment, the PA supply sensing system 426 may comprise an Rx IF path component 416, Rx ADC 418, and the factory calibration adaptation algorithm module 420. During the normal mode of operation, the multiplexer 414 switches to the Rx RF path component 410 to receive wireless data (e.g. RF signals) from the antenna. The Rx RF path component 410 may comprise a low noise amplifier (LNA) and a mixer to receive and process RF signals. The sensing path may not be operational during the normal mode of operation (e.g. transmitting and receiving RF signals for wireless communication) to avoid stability issues. During factory calibration (e.g. not transmitting and receiving RF signals for wireless communication), the open loop ET modulator system 400 may sense the actual PA supply voltage Vcc(t) via the PA supply sensing system 426. The PA supply sensing system 426 may be operational to implement Vcc(t) sensing when the multiplexer 414 switches from the Rx RF path component 410 to the PA supply voltage path. The PA supply sensing system 426 may provide an error signal and/or other information that can be used to update parameters within the PA load variation pre-distortion 402. The PA supply sensing system 426 may continue to be operational during factory calibration until the PA supply voltage Vcc(t) substantially matches (e.g. within a tolerance range) the reference supply voltage Vref(t) under nominal conditions and varying processes. Additionally, the PA supply sensing system 426 may not perform RF down-conversions (e.g. RF signal converted to a lower IF signal) typically found within an analog feedback path for closed loop ET modulators.

In one embodiment, a switch 412 may be connected to one of the multiplexer's 414 inputs and to the PA supply voltage path. When the switch 412 is in an "off" state (e.g. not connected or open circuit) the impedance between the multiplexer's 414 input and the PA supply voltage path may be configured with a relatively high impedance to prevent impacting the efficiency of the open loop ET modulator system 400. Switch 412 may be implemented to isolate the PA supply voltage path from the PA supply sensing system 426 during normal mode of operation. In another embodiment, the PA supply sensing system 426 may not comprise a switch 412 and may use only the multiplexer 414 to switch to the PA supply sensing system 426 during factory calibration.

After multiplexer 414 switches to the PA supply path (e.g. switch is an "on" state), the sensed PA supply voltage Vcc(t) is sent to the Rx IF path component 416. The Rx IF path component 416 may perform filtering (e.g. resistor-capacitor (RC) filtering and/or second order filtering) and/or other signal processing on the PA supply voltage Vcc(t) to remove clock spurs and other signal impairments. The Rx ADC 418 may convert the analog PA supply voltage Vcc(t) to a digital PA supply voltage Vcc(t) and provide (e.g. transmit) the digital PA supply voltage Vcc(t) to the factory calibration adaptation algorithm module 420.

The factory calibration adaptation algorithm module 420 may also receive the reference supply voltage Vref(t) as an input from the delay component 422. The delay component 422 may be any type of delay and/or buffering circuit. The delay component 422 may be configured to provide a long enough delay such that the reference supply voltage Vref(t) arrives at the factory calibration adaption algorithm module 420 about the same time as the digital PA supply voltage Vcc(t). The factory calibration adaptation algorithm module 420 may compare the reference supply voltage Vref(t) with the digital PA supply voltage Vcc(t) and produce an error signal based on the comparison. In one embodiment, the factory calibration adaptation algorithm module 420 may perform the comparison using the SNR of the reference supply voltage Vref(t) and the digital PA supply voltage Vcc(t). The error signal may be outputted to the PA load variation pre-distortion 402 in order to update different attributes within the PA load variation pre-distortion 402. The factory calibration adaptation algorithm module 420 may use any adaptation algorithm well known in the art, such as the Least Square algorithm and/or the recursive Least Square algorithm. The PA load variation pre-distortion 402 will be discussed in more detail below.

Figure 5:
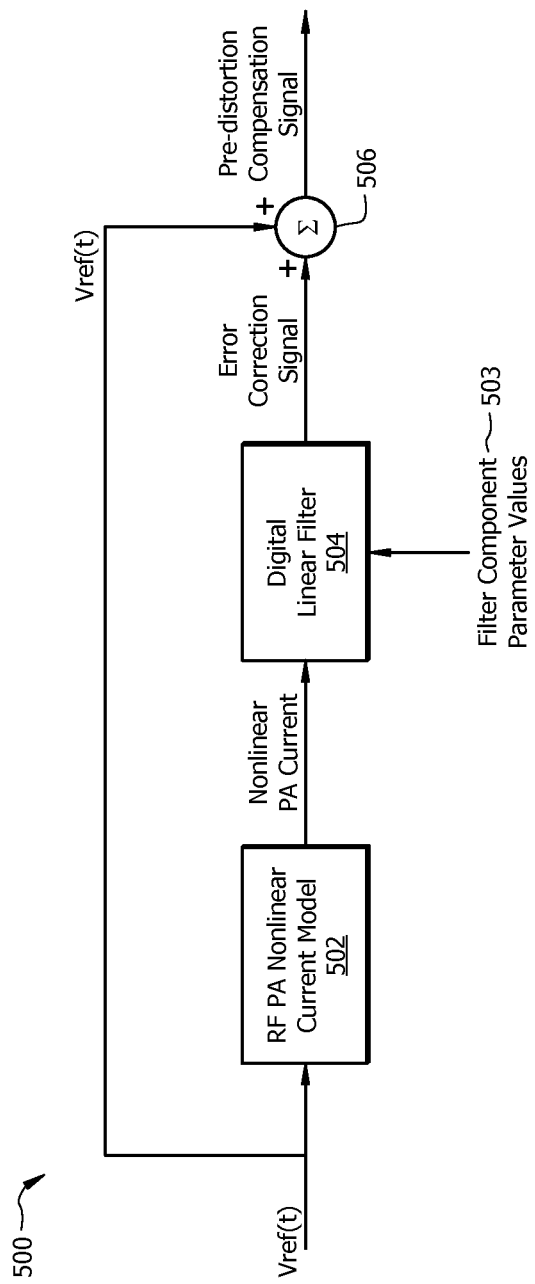
FIG. 5 is a schematic diagram of an embodiment of a PA load variation pre-distortion.

FIG. 5 is a schematic diagram of an embodiment of a PA load variation pre-distortion 500. The PA load variation pre-distortion 500 may comprise an RF PA nonlinear current model 502 and a digital linear filter 504. The RF PA nonlinear current model 502 may receive a reference supply voltage Vref(t) signal and use the reference supply voltage Vref(t) to generate the nonlinear PA current. The RF PA nonlinear current model 502 may implement digital interpolation filters and Lagrange interpolation to obtain the nonlinear PA current. The RF PA nonlinear current model 502 may be computed at a relatively high data rate to improve accuracy. Afterwards, the RF PA nonlinear current model 502 outputs the nonlinear PA current.

Figure 6:
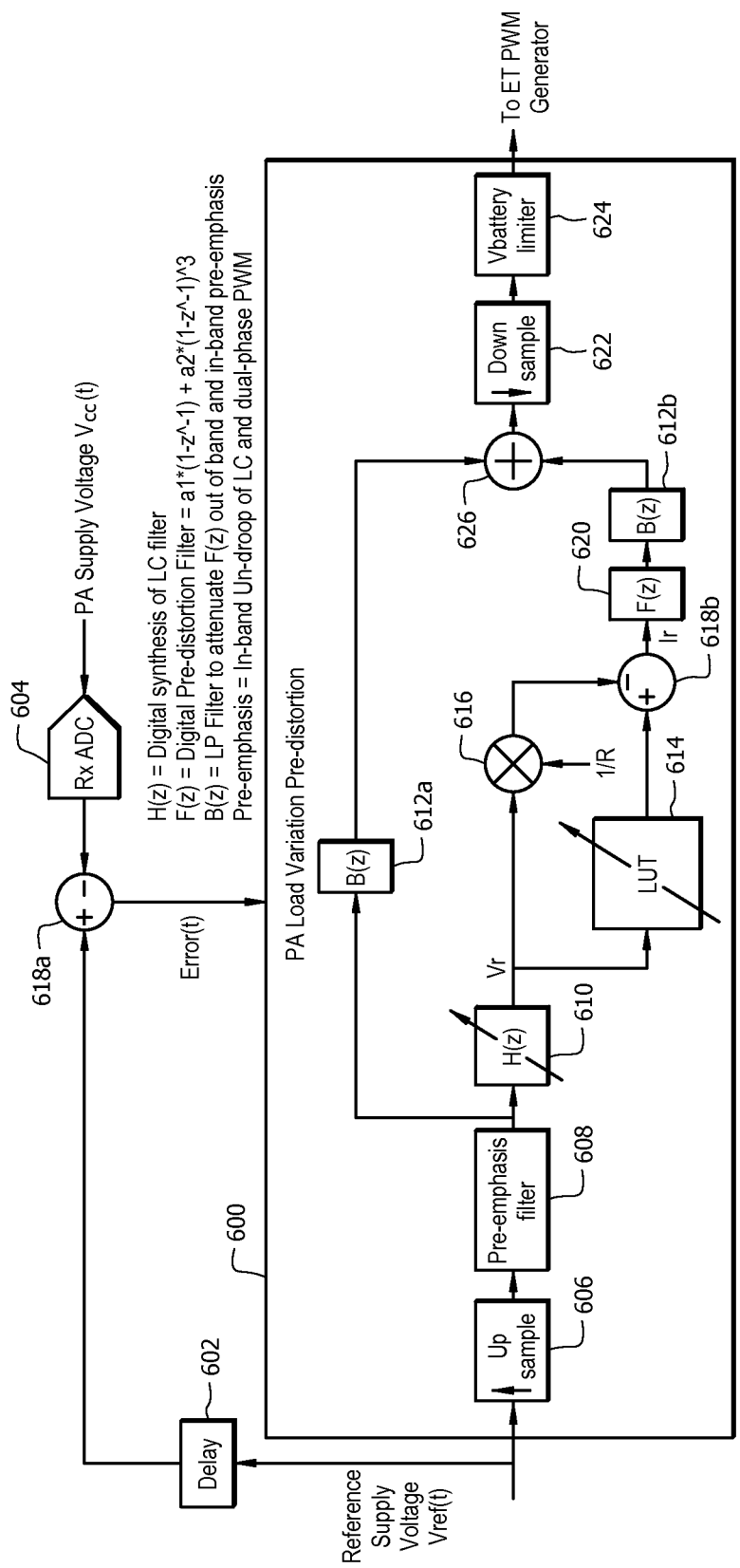
FIG. 6 is a schematic diagram of an embodiment of a PA load variation pre-distortion during factory calibration.
Figure 7:
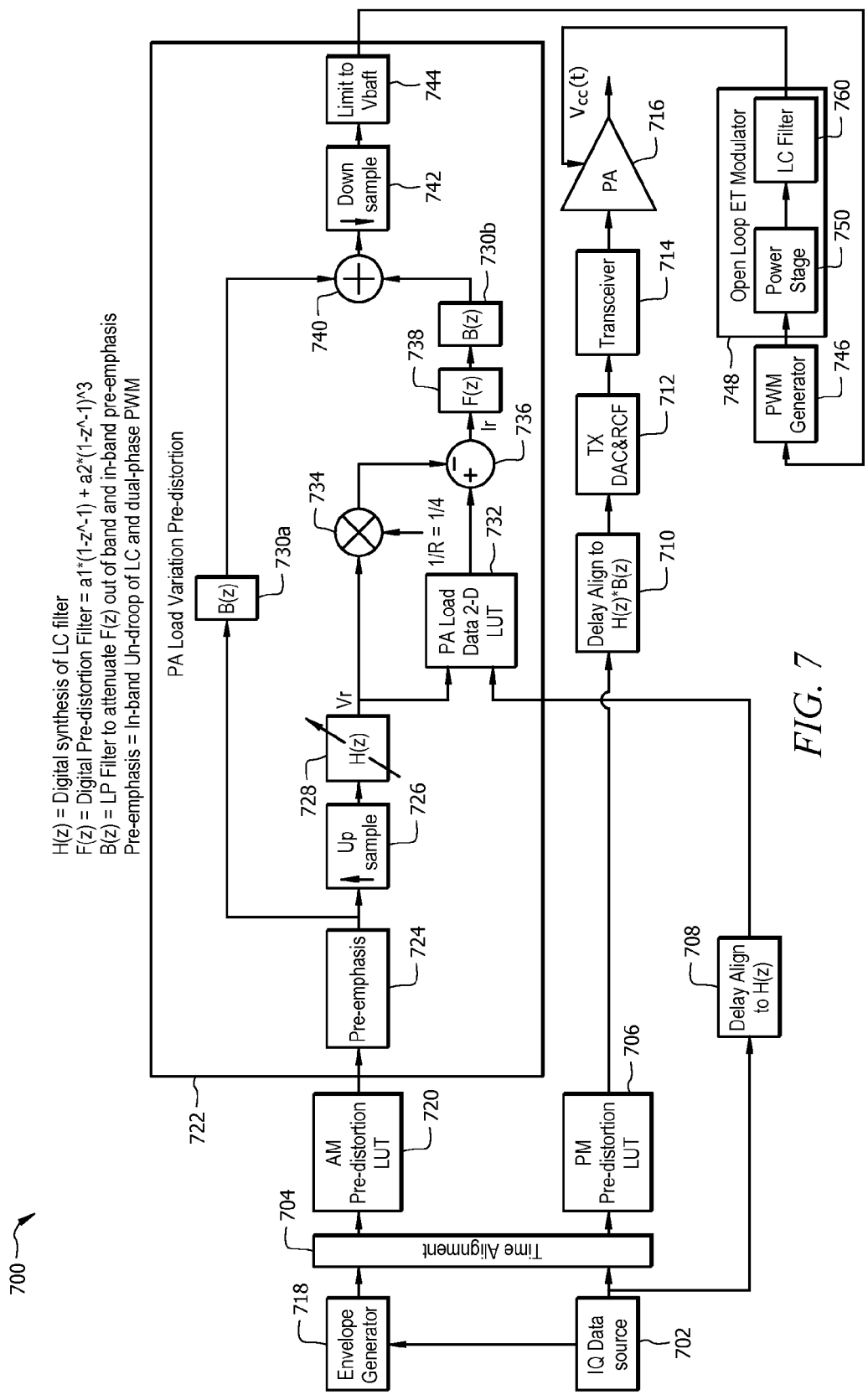
FIG. 7 is a schematic diagram of an embodiment of an open loop ET modulator system with a PA load variation pre-distortion.
Figure 8:
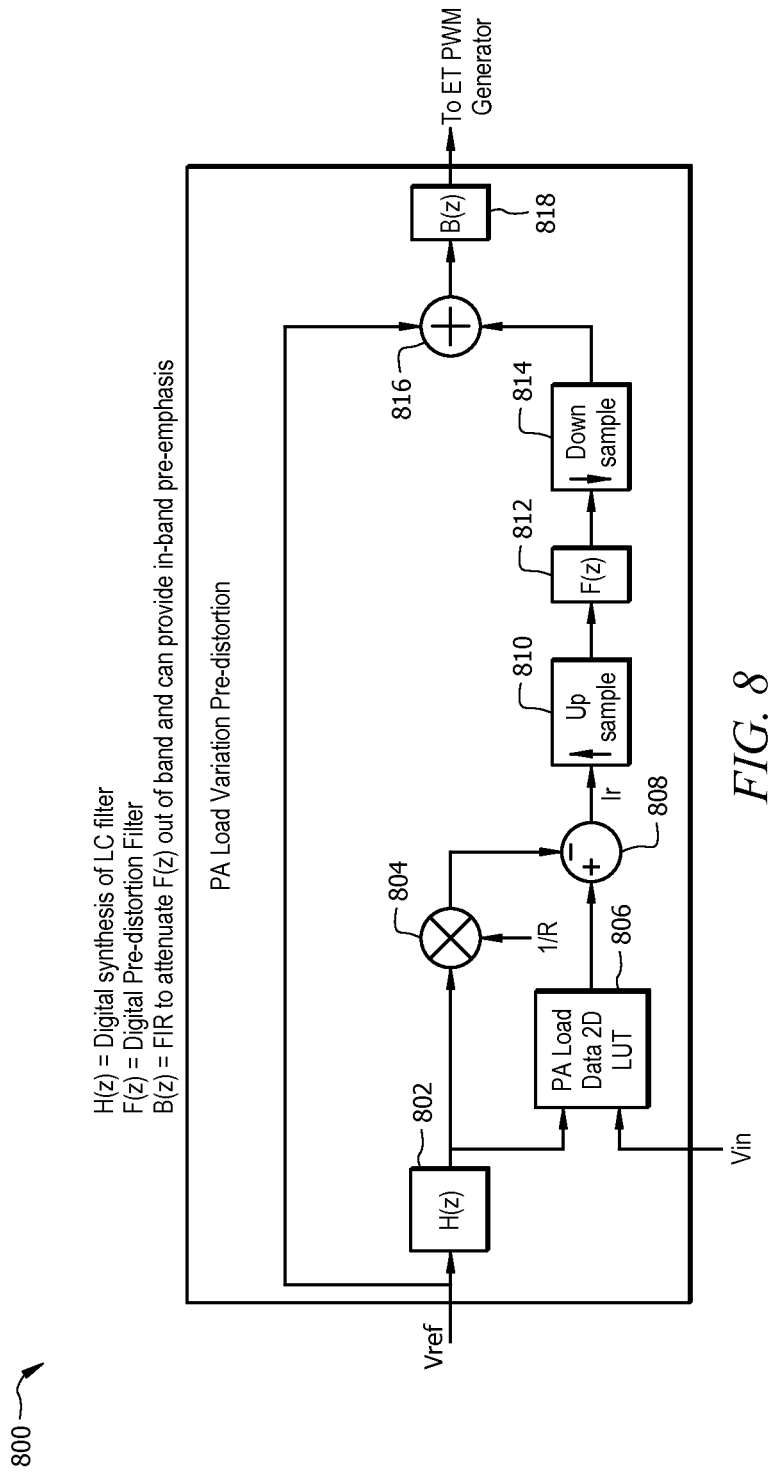
FIG. 8 is a schematic diagram of an embodiment of a PA load variation pre-distortion.

The nonlinear PA current may subsequently be received by a digital linear filter 504, which may convert the nonlinear PA current to a voltage signal. As shown in FIG. 5, the digital linear filter 504 may receive filter component parameter values 503. In one embodiment, the filter component parameter values 503 may be determined during factory calibration. After the digital linear filter 504 filters and converts the nonlinear PA current to a voltage signal, the voltage signal may be sent to an adder 506 to be combined with the reference supply voltage Vref(t) signal to form the pre-distortion compensation signal. FIGS. 6-8 provide a more detailed embodiment of the PA load variation pre-distortion 500.

FIG. 6 is a schematic diagram of an embodiment of a PA load variation pre-distortion 600 during factory calibration. The PA load variation pre-distortion 600 may rely on accurate knowledge of the LC filter response as well as a digital look-up table (LUT) dependent on the dynamic behavior of the PA supply load when stimulated with an IQ signal similar to the one experienced during normal mode of operation (e.g. LTE). Without implementing a feedback sensing of the PA supply voltage during factory calibration, a mismatch may occur between the PA load variation pre-distortion 600 and the actual LC filter response. Moreover, a mismatch between the digital LUT and the actual dynamic PA supply voltage behavior may negatively impact the accuracy of the pre-distortion of the open loop ET modulator.

To overcome the potential mismatch, the reference supply voltage Vref(t) and PA supply voltage Vcc(t) may be compared to generate an error signal Error(t). FIG. 6 illustrates that the Rx ADC 604 outputs the sensed PA supply voltage Vcc(t) as a digital signal, and the delay component 602 sends the reference supply voltage Vref(t) to a comparator 618a. Comparator 618a may be implemented using the factory calibration adaptation algorithm module 420 described in FIG. 4. The Rx ADC converter 604 and delay component 602 may be substantially similar to the Rx ADC converter 418 and delay component 422 in FIG. 4, respectively. In one embodiment, the factory calibration adaptation algorithm module may perform the comparison and provide the error signal Error(t) based on the SNR to the PA load variation pre-distortion 600. The error signal Error(t) may update component parameters within the PA load variation pre-distortion 600 that are used to minimize the SNR between the reference supply voltage Vref(t) and the sensed PA supply voltage Vcc(t). For example, the adaptation algorithm may use a Least Square algorithm to update the parameters that correspond to the H(z) filter 610, B(z) filters 612a and 612b, LUT 614, and F(z) filter 620.

After providing the updated component parameters, the PA load variation pre-distortion 600 may produce an error correction signal that corrects for the SNR difference. The PA load variation pre-distortion 600 may comprise an up sample component 606, a pre-emphasis filter 608, an H(z) filter 610, B(z) filters 612a and 612b, LUT 614, multiplier 616, comparator 618b, F(z) filter 620, a down sample component 622, and Vbattery limiter 624. The up sample component 606 may receive the reference supply voltage Vref(t) signal and increase the sampling rate of the reference supply voltage Vref(t) signal by an appropriate factor (e.g. about five). The sample component 606 may then output the up-sampled reference supply voltage Vref(t) signal to the pre-emphasis filter 608 to filter out any drooping, attenuation distortion, saturation and/or other signal distortions within the up-sampled reference supply voltage Vref(t) signal. The pre-emphasis filter 608 may be used to improve the overall SNR.

The pre-emphasis filter 608 may then output the reference supply voltage Vref(t) to a B(z) filter 612a and an H(z) filter 610. The H(z) filter 610 may represent the digital synthesis of the LC filter within the open loop ET modulator (e.g. LC filter 408 in FIG. 4). The H(z) filter 610 may perform a z transformation of the up-sampled reference supply voltage Vref(t) signal, and may have filtering characteristics based on the transfer function H(z). In another embodiment, the H(z) filter 610 may have filtering characteristics based on the transfer function H(s) when the filtering is implemented in the Laplace domain. The B(z) filters 612a and 612b may be a digital synthesis of a low pass filter that attenuates the out-of-band signals from the F(z) filter 620 and the in-band signals from the pre-emphasis filter 608. The B(z) filters 612a and 612b may be used to limit the voltage output for a pre-distortion compensation signal. For example, the B(z) filter 612 may be a second order Butterworth filter used to limit the voltage output for the pre-distortion compensation signal.

After the H(z) filter 610 processes the reference supply voltage Vref(t) signal, the H(z) filter 610 outputs a voltage value "Vr." The voltage value "Vr" may be sent to LUT 614 and multiplier 616. LUT 614 may be a table that stores the dynamic behavior of the PA supply load. The PA supply load data stored with LUT 614 may be updated from the sensing path during the factory calibration process (e.g. using Error(t) value). LUT 614 may receive the voltage value "Vr" and use the voltage value "Vr" to perform a look up within the table and match the voltage value "Vr" with a corresponding current value. After the look up, LUT 614 may return the corresponding current value and output the current value to comparator 618b.

Multiplier 616 may receive the voltage value "Vr" and multiply the voltage value "Vr" with the value "1/R." "R" may represent the desired varying load experienced by the LC filter within the open loop ET modulator. The multiplier 616 may also output a current value, which may be the same or different from the current outputted from LUT 614. The output of the multiplier 616 is subsequently sent to comparator 618b to determine the difference of the current values sent from multiplier 616 and LUT 614. Based on the two input current values, comparator 618b may determine the correction current "Ir." In other words, current "Ir" may represent the residual or the undesired nonlinear current error. "Ir" may be represented by equation 1 shown below:

$$Ir(Vcc(t), Vin(t)) = I(Vcc(t), Vin(t)) - Vcc(t)/R \quad (1)$$

Vcc(t) and Vin(t) may represent the PA supply voltage and the PA input signal, respectively. Ir(Vcc(t), Vin(t)) may represent the residual nonlinear current error, while I(Vcc(t), Vin(t)) may represent the actual nonlinear current. Both Ir(Vcc(t), Vin(t)) and I(Vcc(t), Vin(t)) may be a function of Vcc(t) and Vin(t). In one embodiment, the RF PA nonlinear current model 502 shown in FIG. 5 may comprise the up sample component 606, a pre-emphasis filter 608, an H(z) filter 610, LUT 614, multiplier 616, and comparator 618b to generate the nonlinear PA current (e.g. "Ir").

Afterwards, comparator 618b outputs the correction current "Ir" signal to the F(z) filter 620. The F(z) filter 620 may be a high pass filter that receives the current "Ir" and converts the current "Ir" back into a voltage signal. As such, the F(z) filter 620 may be the digital pre-distortion filter that determines the correction voltage signal. In one embodiment, the F(z) filter's 620 transfer function may be represented as an finite impulse response (FIR) (e.g. $a_1(1-z^{-1})+a_2(1-z^{-1})^3$). In another embodiment, the F(z) filter 620 (Laplace equivalent is F(s)) may be represented as an infinite impulse response (IIR). The F(z) filter 620 may then output the correction voltage signal to the B(z) filter 612b, which band limits the correction voltage signal to form the error correction signal. The B(z) filter 612b outputs the error correction signal to the adder 626, which adds the error correction signal to the signal received from B(z) 612a (e.g. the reference supply voltage Vref(t) signal) to form the pre-distortion compensation signal. The adder 626 may forward the pre-distortion compensation signal to the down-sample component 622 to decrease the sampling rate by a desired factor (e.g. about a factor of 5). Afterwards, the pre-distortion compensation signal may enter the Vbattery limiter 624 to limit the voltage ranges of the pre-distortion compensation signal to the battery voltage ranges. In one embodiment, the digital linear filter 504 shown in FIG. 5 may comprise the F(z) filter 620 and B(z) filter 612b to generate the error correction signal.

In one embodiment, the parameter updates for error signal Error(t) may be obtained by determining coefficients for the H(s) and F(s) filtering parameters (Z domain equivalents are H(z) and F(z), respectively). Assuming that PA load variation pre-distortion is turned off during normal operation, and thus the reference supply voltage Vref(t) is outputted to the ET PWM generator, the PA supply voltage Vcc(t) may be expressed with equation 2:

$$Vcc(t) = \sum_{k=0}^{N} b_k \frac{d^k Vref(t)}{dt^k} - \sum_{k=1}^{M} a_k \frac{d^k Vcc(t)}{dt^k} - \sum_{k=1}^{L} c_k \frac{d^k Ir(Vcc(t), Vin(t))}{dt^k} \tag{2}$$

Additionally, "Ir," which may represent the error correction current in the Laplace domain (e.g. Ir (s)), may be expressed with equation 3:

$$Ir(s) = \text{Laplace}\{Ir(Vcc(t), Vin(t))\} \tag{3}$$

Alternatively, equation 3 may be implemented in the Z domain. Equation 2, which is represented in the time domain, may then be converted to the Laplace domain to form equation 4 shown below:

$$Vcc(s) = \sum_{k=0}^{N} b_k s^k Vref(s) - \sum_{k=1}^{M} a_k s^k Vcc(s) - \sum_{k=1}^{L} c_k s^k Ir(s) \tag{4}$$

Equation 4 may then be modified to form equation 5 and 6, which is shown below:

$$Vcc(s) = Vref(s) \left[ \frac{\sum_{k=0}^{N} b_k s^k}{1 + \sum_{k=1}^{M} a_k s^k} \right] - Ir(s) \left[ \frac{\sum_{k=1}^{L} c_k s^k}{1 + \sum_{k=0}^{N} b_k s^k} \right] \left[ \frac{\sum_{k=1}^{N} b_k s^k}{1 + \sum_{k=1}^{M} a_k s^k} \right] \tag{5}$$

$$Vcc(s) = Vref(s) H(s) - Ir(s) F(s) H(s) \tag{6}$$

Thus, equation 6 can be used to determine the transfer function H(s) and F(s), (e.g. the coefficients a1 ... aM, b0 ... bN, and c1 ... cL) such that the left side of equations 6 is close in the SNR sense to the right side of equation 6. In other words, equation 6 is used to minimize the frequency domain error signal Error(s), which is effectively minimizing the time domain error signal Error(t)). A system of equations Ax=b using a Least Squares approach may be used to obtain the coefficients, a1 ... aM, b0 ... bN, and c1 ... cL. Table 1 is an example of the matrix format using Ax=b to solve for the different coefficients:

TABLE 1

$$\begin{bmatrix} Vref(s_1) & s_1 Vref(s_1) \ldots s_1^N Vref(s_1) & s_1 Vcc(s_1) \ldots s_1^M Vcc(s_1) & Ir(s_1) \ldots s_1^L Ir(s_1) \\ Vref(s_2) & s_2 Vref(s_2) \ldots s_2^N Vref(s_2) & s_2 Vcc(s_2) \ldots s_2^M Vcc(s_2) & Ir(s_2) \ldots s_2^L Ir(s_2) \\ \ldots & \ldots & \ldots & \\ \ldots & \ldots & \ldots & \\ \ldots & \ldots & \ldots & \\ \ldots & \ldots & \ldots & \\ \ldots & \ldots & \ldots & \\ \ldots & \ldots & \ldots & \\ \ldots & \ldots & \ldots & \\ \ldots & \ldots & \ldots & \\ \ldots & \ldots & \ldots & \\ \vdots & \ddots & \vdots & \\ Vref(s_K) & s_K Vref(s_K) \ldots s_K^n Vref(s_K^n) & s_K Vcc(s_K) \ldots s_K^M Vcc(s_K) & s_K Ir(s_K) \ldots s_K^L Ir(s_K) \end{bmatrix} \begin{bmatrix} b_0 \\ b_1 \\ \cdot \\ \cdot \\ b_N \\ a_1 \\ a_2 \\ \cdot \\ \cdot \\ a_M \\ c_1 \\ c_2 \\ \cdot \\ \cdot \\ c_L \end{bmatrix} = \begin{bmatrix} Vcc(s_1) \\ Vcc(s_2) \\ Vcc(s_3) \\ \cdot \\ \cdot \\ \cdot \\ \cdot \\ \cdot \\ \cdot \\ \cdot \\ \cdot \\ \cdot \\ \cdot \\ \cdot \\ Vcc(s_K) \end{bmatrix}$$

FIG. 7 is a schematic diagram of an embodiment of an open loop ET modulator system 700 with a PA load variation pre-distortion 722. The IQ data source 702, envelope generator 718, transceiver 714, and PA 716 may be substantially similar to the IQ data source 301, envelop generator 308, transceiver 304, and PA 306 as described in FIG. 3, respectively. The PWM generator 746, open loop ET modulator 748, ET power stage 750, and LC filter 760 may be substantially similar to the PWM generator 404, open loop ET modulator 409, ET power stage 406, and LC filter 408 in FIG. 4, respectively. The pre-emphasis filter 724, up sample component 726, H(z) filter 728, B(z) filters 730a and 730b, multiplier 734, comparator 736, F(z) filter 738, adder 740, down sample component 742 and Vbattery limiter 744 are substantially similar to pre-emphasis filter 608, up sample component 606, H(z) filter 610, B(z) filters 612a and 612b, multiplier 616, comparator 618b, F(z) filter 620, adder 626, down sample component 622 and Vbattery limiter 624 as described in FIG. 6, respectively.

The PA load variation pre-distortion 722 may be similar to the PA load variation pre-distortion 600 as described in FIG. 6 except that the pre-emphasis filter 724 is located before the up sample component 726 in reference to the signal input and a PA load data two dimensional (2-D) LUT 732 may be used to perform the look up function. As shown in FIG. 7, the PA load data 2-D LUT 732 may receive and perform the look up using the voltage signal "Vr" input and the IQ data from the IQ data source 702. After the look up, the PA load data 2-D LUT 732 may output a current value based on the anticipated PA supply load.

The open loop ET modulator system 700 may also comprise a time alignment 704, an amplitude modulation (AM) pre-distortion LUT 720, a phase modulation (PM) pre-distortion LUT 706, a delay component 710 to align the input signal for the PA with H(z) and B(z) processing, a delay component 708 to align the input signals for the PA Load Data 2-D LUT 232, and a DAC and RCF component 712. The time alignment 704 and delay component 710 may align the RF signal from the signal path with the corresponding PA supply voltage Vcc(t). The DAC and RCF component 712 may perform a digital-to-analog conversion of the IQ data and implement an RCF to smooth out the converted analog signal. The AM pre-distortion LUT 720 may be used to estimate the amplitude-to-amplitude distortion caused by the PA 716 and the PM pre-distortion LUT 706 may be used to estimate the amplitude-to-phase distortion caused by the PA 716. Persons of ordinary skill in the art are aware that a variety of implementations and/or methods may be used to implement the AM pre-distortion LUT 720 and the PM pre-distortion LUT 706.

FIG. 8 is a schematic diagram of an embodiment of a PA load variation pre-distortion 800. The a H(z) filter 802, the multiplier 804, PA Load Data 2-D LUT 806, the comparator 808, up sample component 810, F(z) filter 812, a down sample component 814, an adder 816, and a B(z) filter 818 within the PA load variation pre-distortion 800 are substantially similar to H(z) filter 728, multiplier 734, PA Load Data 2-D LUT 732, comparator 736, up sample component 726, F(z) filter 738, down sample component 742, adder 740, and B(z) filter 730a and 730b as described in FIG. 7, respectively. As shown in FIG. 8, the up sample component 810 may be placed after generating "Ir," and the down sample component 814 may be placed before adding the error correction signal and the reference supply voltage Vref(t). Moreover, the B(z) filter 818 may be placed after generating the pre-distortion compensation signal.

Figure 9:
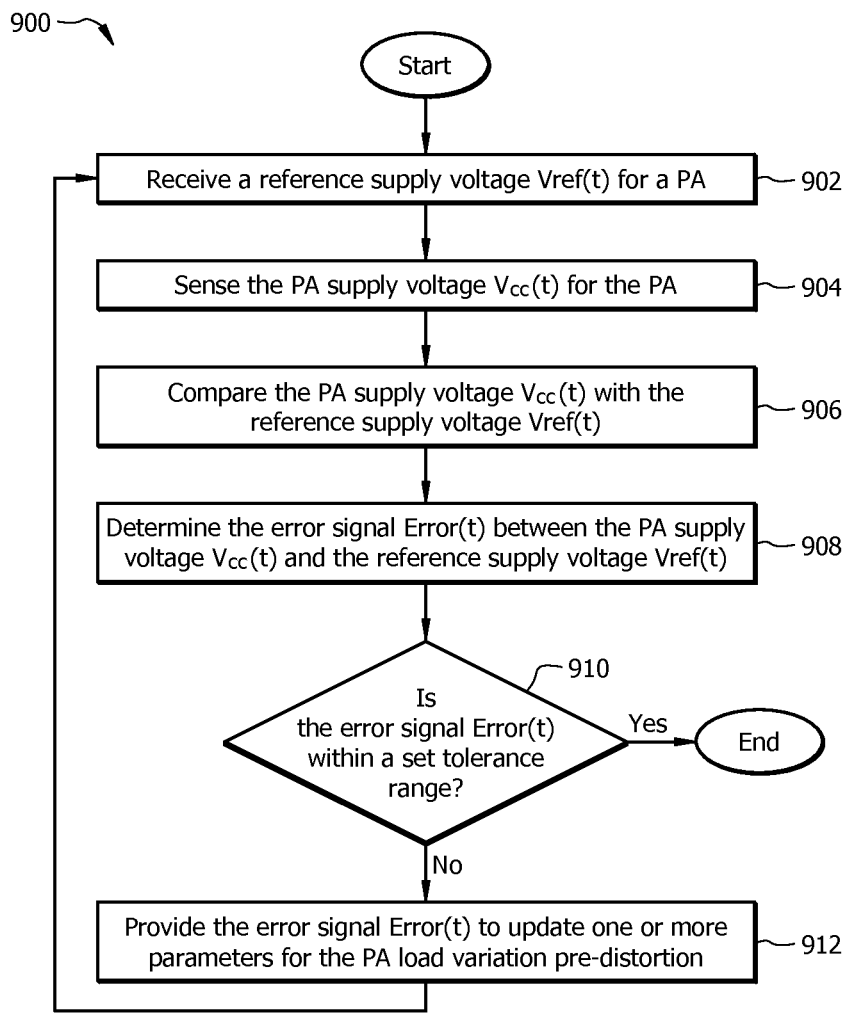
FIG. 9 is a flowchart of an embodiment of a method to update one or more component parameters for a PA load variation pre-distortion during factory calibration.

FIG. 9 is a flowchart of an embodiment of a method 900 to update one or more component parameters for a PA load variation pre-distortion during factory calibration. Method 900 may be implemented within the PA supply sensing system 426 and/or the factory calibration adaptation algorithm module 420 discussed in FIG. 4. Method 900 may start at block 902 and receive a known reference supply voltage Vref(t) for a PA. Recall that during factory calibration, the reference supply voltage Vref(t) may be an IQ signal similar to the one experienced during normal mode of operation (e.g. LTE). Method 900 may then proceed to block 904 and sense the PA supply voltage Vcc(t) for the PA. In one embodiment, the PA supply voltage Vcc(t) may be a digital signal. Afterwards, method 900 continues to block 906 and compares the PA supply voltage Vcc(t) with the reference supply voltage Vref(t). Additionally, the comparison may be based on the SNR of the PA supply voltage Vcc(t) and the reference supply voltage Vref(t).

Method 900 may move to block 908 and determine the error signal Error(t) between the PA supply voltage Vcc(t) and the reference supply voltage Vref(t). Recall that the Least square algorithm and Ax=b matrix format (e.g. Table 1) may be used to determine the optimal H(s) and F(s) that minimize the error signal Error(t). Due to the complexity, the system of equations Ax=b is typically solved iteratively using Least Mean Square adaptive techniques in which the error signal Error(t) is used to iteratively update H(s) and F(s) (or effectively H(z) and F(z)). In another embodiment, the pre-calculated H(z) and F(z) coefficients representing the LC filter with the LC component variations (e.g. +/−10%) can be stored and one set of coefficients is used during each iteration. Method 900 continues to block 910 and determines whether the error signal Error(t) is within a set tolerance range. If the error signal Error(t) is within a set tolerance range, then method 900 ends. On the other hand, if the error signal Error(t) is outside a set tolerance range (e.g. not within the set tolerance range), then method 900 may move to block 912. At block 912, method 900 may provide the error signal Error(t) to update one or more component parameters (e.g. H(z) and F(z)) for the PA load pre-distortion. Afterwards, method 900 returns back to block 902.

Figure 10:
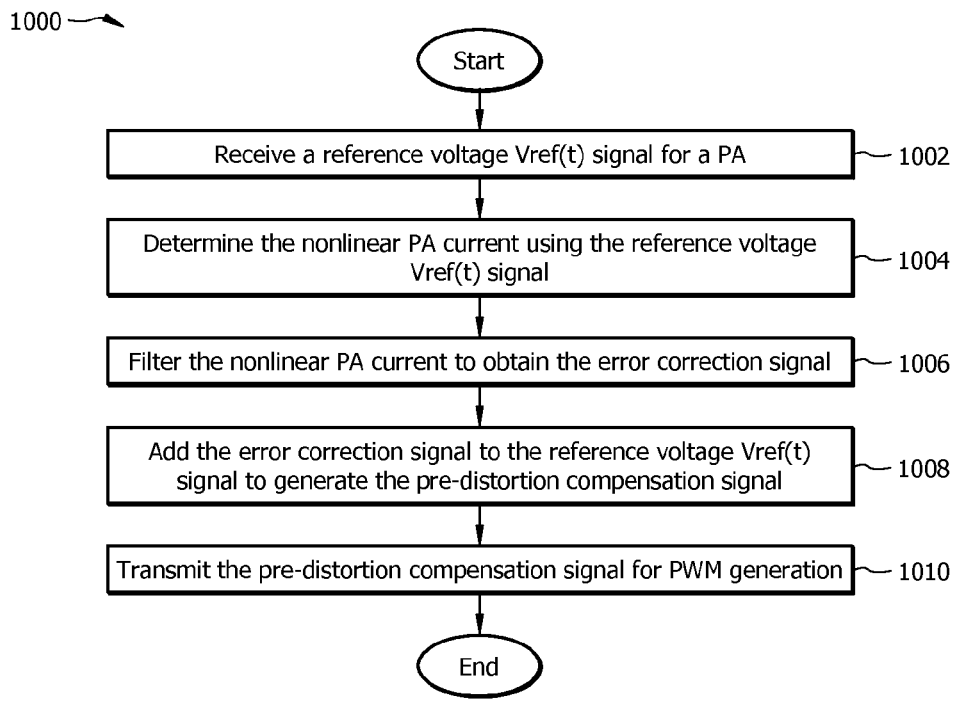
FIG. 10 is a flowchart of an embodiment of a method for a PA load variation pre-distortion prior to pulse-width-modulation (PWM) generation.

FIG. 10 is a flowchart of an embodiment of a method 1000 for a PA load variation pre-distortion prior to PWM generation. Method 1000 may be implemented within the PA load variation pre-distortion 402, 500, 600, 722, and 800 as discussed in FIGS. 4-8. Method 1000 may start at block 1002 and receive a reference supply voltage Vref(t) for a PA. Method 1000 may start at block 1002 and receive a reference supply voltage Vref(t) for a PA. After generating the nonlinear PA current, method 1000 may proceed to block 1006 and filter the nonlinear PA current to obtain the error correction signal. At block 1006, method 1000 may filter the nonlinear PA current to convert it into a voltage signal. Method 1000 may move to block 1008 and add the correction signal to the reference supply voltage Vref(t) signal to generate the pre-distortion compensation signal. Afterwards, method 1000 may move to block 1010 and transmit the pre-distortion compensation signal for PWM generation.

Figure 11:
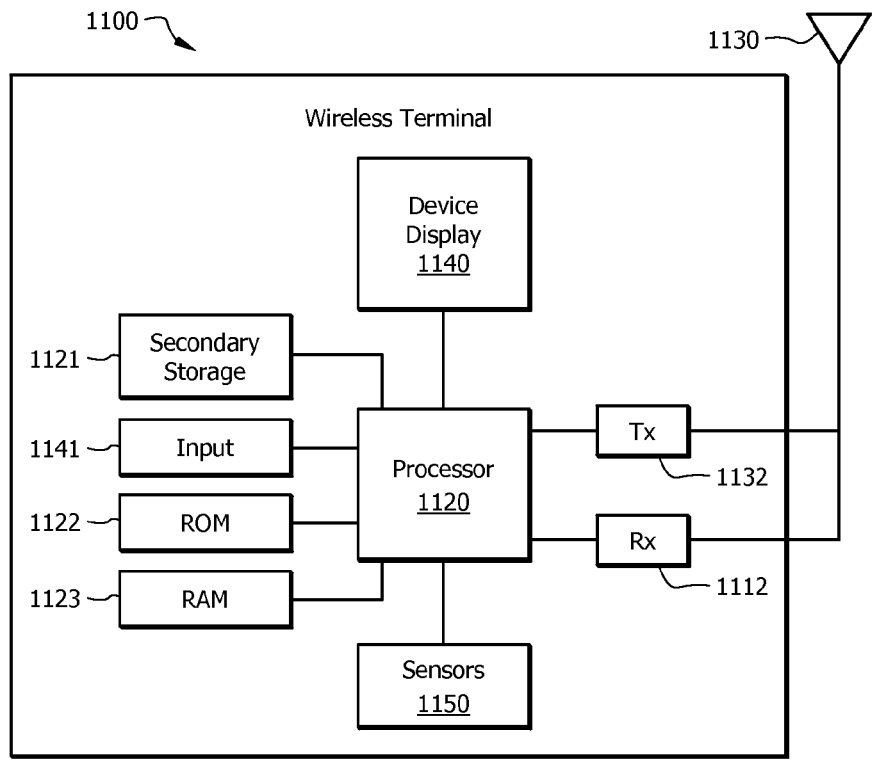
FIG. 11 is a schematic diagram of an embodiment of a wireless terminal.

FIG. 11 is a schematic diagram of an embodiment of a wireless terminal 1100, which may comprise any of the following: the open loop ET modulator system 300 and 400, the open loop ET modulator 314, 409, and 748, the PA load variation pre-distortion 500, 600, 722, and 800, and the PA supply sensing system 316 and 426. Wireless terminal 1100 may comprise a two-way wireless communication device having voice and/or data communication capabilities. In some aspects, voice communication capabilities are optional.

The wireless terminal 1100 generally has the capability to communicate with other computer systems on the Internet and/or other networks. Depending on the exact functionality provided, the wireless terminal 1100 may be referred to as a data messaging device, a tablet computer, a two-way pager, a wireless e-mail device, a cellular telephone with data messaging capabilities, a wireless Internet appliance, a wireless device, a smart phone, a mobile device, or a data communication device, as examples. At least some of the features/methods described in the disclosure. For example, the open loop ET modulator system 300 and 400, the open loop ET modulator 314, 409, and 748, the PA load variation predistortion 500, 600, 722, and 800, and the PA supply sensing system 316 and 426 may be implemented in the wireless terminal 1100.

Wireless terminal 1100 may comprise a processor 1120 (which may be referred to as a central processor unit or CPU) that may be in communication with memory devices including secondary storage 1121, read only memory (ROM) 1122, and random access memory (RAM) 1123. The processor 1120 may be implemented as one or more general-purpose CPU chips, one or more cores (e.g. a multi-core processor), or may be part of one or more application specific integrated circuits (ASICs) and/or digital signal processors (DSPs). The processor 1120 may also be configured to perform computations as described in equations 1-6 and matrix calculations shown in Table 1.

The secondary storage 1121 may be comprised of one or more solid state drives and/or disk drives which may be used for non-volatile storage of data and as an over-flow data storage device if RAM 1123 is not large enough to hold all working data. Secondary storage 1121 may be used to store programs that are loaded into RAM 1123 when such programs are selected for execution. The ROM 1122 may be used to store instructions and perhaps data that are read during program execution. ROM 1122 may be a non-volatile memory device and may have a small memory capacity relative to the larger memory capacity of secondary storage 1121. The RAM 1123 may be used to store volatile data and perhaps to store instructions. Access to both ROM 1122 and RAM 1123 may be faster than to secondary storage 1121. The RAM 1123, ROM 1122, and/or the secondary storage 1121 may be used to store data within the LUT 614, the PA Load Data 2-D LUT 732, and/or implement the factory adaptation algorithm module 420, methods 900, and 1000.

Wireless terminal 1100 may be any device that communicates data (e.g., packets) wirelessly with a network. The wireless terminal 1100 may comprise a receiver 1112, which may be configured for receiving data, packets, or frames from other components. The receiver 1112 may be coupled to the processor 1120, which may be configured to process the data and determine to which components the data is to be sent. The wireless terminal 1100 may also comprise a transmitter (Tx) 1132 coupled to the processor 1120 and configured for transmitting data, packets, or frames to other components. The receiver 1112 and transmitter 1132 may be coupled to an antenna 1130, which may be configured to receive and transmit wireless signals (e.g. RF signals).

The wireless terminal 1100 may also comprise a device display 1140 coupled to the processor 1120, for displaying output thereof to a user. The device display 1140 may comprise a light-emitting diode (LED) display, a Color Super Twisted Nematic (CSTN) display, a thin film transistor (TFT) display, a thin film diode (TFD) display, an organic LED (OLED) display, an active-matrix OLED display, or any other display screen. The device display 1140 may display in color or monochrome and may be equipped with a touch sensor based on resistive and/or capacitive technologies.

The wireless terminal 1100 may further comprise input devices 1141 coupled to the processor 1120, which may allow a user to input commands to the wireless terminal 1100. In the case that the device display 1140 comprises a touch sensor, the device display 1140 may also be considered an input device 1141. In addition to and/or in the alternative, an input device 1141 may comprise a mouse, trackball, built-in keyboard, external keyboard, and/or any other device that a user may employ to interact with the wireless terminal 1100. The wireless terminal 1100 may further comprise sensors 1150 coupled to the processor 1120. Sensors 1150 may detect and/or measure conditions in and/or around the wireless terminal 1100 at a specified time and transmit related sensor input and/or data to processor 1120.

It is understood that by programming and/or loading executable instructions onto the wireless terminal 1100, at least one of the receiver 1112, processor 1120, secondary storage 1121, ROM 1122, RAM 1123, antenna 1130, transmitter 1132, input device 1141, device display 1140, and/or sensors 1150, are changed, transforming the wireless terminal 1100 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware. For example, in an ASIC, because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 70 percent, 71 percent, 72 percent, ..., 95 percent, 96 percent, 97 percent, 98 percent, 99 percent, or 100 percent. Moreover, any numerical range defined by two R numbers as defined in the above is also specifically disclosed. The use of the term about means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus for providing envelope tracking (ET), comprising:
   a memory;
   a processor coupled to the memory, wherein the memory includes instructions that when executed by the processor cause the apparatus to perform the following:
      switch to a supply sensing path during factory calibration using a sensing system within a wireless terminal containing an antenna at the time of the switch;
      determine a power amplifier (PA) supply voltage from the supply sensing path;
      compare the PA supply voltage to a corresponding reference supply voltage during factory calibration; and
      generate an error signal based on a difference between the PA supply voltage during factory calibration,
   wherein the error signal is used to update one or more parameters that generate a PA load pre-distortion signal, and
   wherein the PA load pre-distortion signal is used to generate the PA supply voltage.

2. The apparatus of claim 1, wherein the supply sensing path is not operational during non-factory calibration use.

3. The apparatus of claim 1, wherein the instructions executed by the processor further cause the apparatus to compare the PA supply voltage and the corresponding reference supply voltage by implementing an adaptation algorithm.

4. The apparatus of claim 1, wherein the corresponding reference supply voltage is a Long Term Evolution (LTE) signal.

5. The apparatus of claim 1, wherein the error signal is used to update the one or more parameters by updating one or more filtering parameters and one or more PA load values used to generate the PA load pre-distortion signal.

6. The apparatus of claim 1, wherein the corresponding reference supply voltage is used to generate the PA load pre-distortion signal.

7. The apparatus of claim 1, wherein the PA load pre-distortion signal is used to match the PA supply voltage with the corresponding reference supply voltage.

8. The apparatus of claim 1, wherein the instructions executed by the processor further cause the apparatus to perform an open loop ET modulation during transmission of radio frequency (RF) signals.

9. The apparatus of claim 1, wherein the instructions executed by the processor further cause the apparatus to convert the PA power supply voltage to a digital signal.

10. The apparatus of claim 1, wherein the PA supply voltage is sensed only during factory calibration.

11. An apparatus for providing envelope tracking (ET), comprising:
    a power amplifier (PA) supply sensing system within a wireless terminal containing an antenna during any switching of states; and
    a PA load variation pre-distortion operatively coupled to the PA supply sensing system,
    wherein the PA supply sensing system is configured to:
       switch to an on state during factory calibration;
       switch to an off state during transmission of radio frequency (RF) signals;
       compare a reference supply voltage signal to a PA supply voltage signal during the on state; and
       generate an error signal used to update one or more parameters within the PA load variation pre-distortion,
    wherein the PA load variation pre-distortion is configured to generate a pre-distortion compensation signal using the updated parameters.

12. The apparatus of claim 11, wherein the error signal represents a difference between the reference supply voltage signal and the PA supply voltage signal.

13. The apparatus of claim 11, further comprising an open loop ET modulator configured to generate the PA supply voltage signal using the pre-distortion compensation signal.

14. The apparatus of claim 11, wherein the pre-distortion compensation signal is generated by correcting the reference signal based on the updated parameters.

15. The apparatus of claim 11, wherein the PA supply sensing system comprises a receiver (Rx) intermediate frequency (IF) path component and an Rx analog-to-digital conversion.

16. A method for implementing envelope tracking (ET), the method comprising:
- switching from a receiver (Rx) radio frequency (RF) path to a supply sensing path during factory calibration using a sensing system within a wireless terminal containing an antenna at the time of the switch;
- sensing a power amplifier (PA)'s supply voltage via the supply sensing path;
- comparing the PA's supply voltage to a corresponding reference supply voltage;
- determining the difference between the PA's supply voltage and the corresponding reference supply voltage; and
- updating one or more parameters used to perform a PA load pre-distortion during factory calibration,
- wherein the PA load pre-distortion is used to match the PA's supply voltage to the corresponding reference supply voltage.

17. The method of claim 16, wherein the PA's supply voltage is not sensed during transmission of RF signals.

18. The method of claim 16, further comprising performing an ET modulation to generate the PA's supply voltage.

19. The method of claim 16, wherein an adaptation algorithm is used to compare the PA's supply voltage to the corresponding reference supply voltage.

20. The method of claim 16, wherein the corresponding reference supply voltage is used to perform a PA load pre-distortion during factory calibration.

\* \* \* \* \*